(12) United States Patent
Li et al.

(10) Patent No.: US 7,018,779 B2
(45) Date of Patent: Mar. 28, 2006

(54) APPARATUS AND METHOD TO IMPROVE RESIST LINE ROUGHNESS IN SEMICONDUCTOR WAFER PROCESSING

(75) Inventors: Wai-kin Li, Poughkeepsie, NY (US); Rajeev Malik, Pleasantville, NY (US); Joseph J. Mezzapelle, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 204 days.

(21) Appl. No.: 10/338,273

(22) Filed: Jan. 7, 2003

(65) Prior Publication Data

US 2004/0131979 A1   Jul. 8, 2004

(51) Int. Cl.
*G03F 7/00* (2006.01)

(52) U.S. Cl. .................. 430/313; 430/314; 430/950

(58) Field of Classification Search ............. 430/313, 430/314, 950; 427/255.29
See application file for complete search history.

(56) References Cited

U.S. PATENT DOCUMENTS

| | | | | |
|---|---|---|---|---|
| 4,419,813 A | * | 12/1983 | Iwai | 438/433 |
| 4,641,033 A | * | 2/1987 | Petelin et al. | 250/492.1 |
| 4,825,277 A | * | 4/1989 | Mattox et al. | 257/639 |
| 5,580,701 A | * | 12/1996 | Lur et al. | 430/316 |
| 6,153,467 A | * | 11/2000 | Wu | 438/257 |
| 6,323,310 B1 | * | 11/2001 | Puligadda et al. | 528/423 |
| 6,331,479 B1 | * | 12/2001 | Li et al. | 438/618 |
| 6,743,700 B1 | * | 6/2004 | Asami et al. | 438/476 |
| 2003/0017670 A1 | * | 1/2003 | Luoh et al. | 438/257 |

OTHER PUBLICATIONS

Derwent Abstract of TW 441002, "Metal interconnect production comprises forming dielectric layer on sustrate having copper wire, and forming contact opening and trench in dielectric layer to expose surface of cooper wire", Chen et al., Jun. 2001.*

* cited by examiner

*Primary Examiner*—Nicole Barreca
(74) *Attorney, Agent, or Firm*—DeLio & Peterson LLC; Robert Curcio; Todd M. C. Li

(57) ABSTRACT

A process for prohibiting amino group transport from the top surface of a layered semiconductor wafer to a photoresist layer introduces a thin film oxynitride over the silicon nitride layer using a high temperature step of nitrous oxide ($N_2O$) plus oxygen ($O_2$) at approximately 300° C. for about 50 to 120 seconds. By oxidizing the silicon nitride layer, the roughness resulting from the adverse affects of amino group transport eliminated. Moreover, this high temperature step, non-plasma process can be used with the more advanced 193 nanometer technology, and is not limited to the 248 nanometer technology. A second method for exposing the silicon nitride layer to an oxidizing ambient, prior to the application of antireflective coating, introduces a mixture of $N_2H_2$ and oxygen ($O_2$) ash at a temperature greater than or equal to 250° C. for approximately six minutes. This is followed by an $O_2$ plasma clean and/or an Ozone clean, and then the subsequent layering of the ARC and photoresist.

11 Claims, 2 Drawing Sheets

APPARATUS AND METHOD TO IMPROVE RESIST LINE ROUGHNESS IN SEMICONDUCTOR WAFER PROCESSING

BACKGROUND OF THE INVENTION

1. Field of the Invention

This invention relates to semiconductor wafer processing, and more specifically to the elimination of amino groups and their subsequent effect on photoresist roughness.

2. Description of Related Art

Many substrates used in the field of manufacturing integrated circuit elements have high reflectivity that, upon exposure to ultraviolet light, causes light passing through a photoresist layer to be reflected upon the surface of the substrate and again incident into the photoresist layer. This has been shown to cause standing waves and patterned defects. Typically, antireflective coatings (ARC) have been placed between the resist and the substrate in order to prevent light reflection from the substrate into the resist. The ARC absorbs light directed towards the surface of the substrate, thus minimizing exposure of the resist from reflections. The ARC is commonly comprised of an organic polymer solution containing light-absorbing dye dispersed or dissolved therein to the surface of the substrate, or a polymer itself, which has radiation absorbing properties. Inorganic compounds such as silicon oxynitride, deposited by means of plasma enhanced chemical vapor deposition (PECVD), have been shown effective as antireflective coatings for shorter light wavelengths, such as the deep ultraviolet spectrum. However, even with an ARC layer, distortion of line profiles has been observed in the developed photoresist images. In part, reflections are not completely cancelled, and other factors contribute to unwanted photoresist exposure.

It is desirable to suppress reflections from underlying layers so that the photoresist is not exposed to the reflected light waves, which leads to variation in critical dimensions. The total distance that a light wave travels is determined by the thickness and index of refraction of the material that it passes through. If this thickness varies, as it will from one manufacturing process to another, the light waves reflected off a bottom surface will not be 180° out of phase with the light reflected off a top surface. Thus, destructive interference will not be complete, and light will reflect into the photoresist causing undesirable exposure.

Furthermore, contaminants that are incompatible with the photoreactive polymeric material can migrate into the photoresist layer from the ARC layer or other vicinal layer. These contaminants can poison the photoresist layer, and lead to the formation of a photoresist footing or T-top structure. These structures are anomalies in the otherwise precise dimensions of the exposed photoresist.

Line profile distortion has been shown to occur from the presence on the surface of the ARC due to amino ($NH_2$) groups that settle during the PECVD process. Any delay depositing a photoresist layer after the ARC layer is deposited will expose the ARC layer to air and acidic airborne contaminants and/or basic contaminants at the substrate surface. These, in turn, will react with the amino groups to form outgrowths on the photoresist.

In U.S. Pat. No. 6,242,361 issued to Lee, et al., on Jun. 5, 2001, entitled "PLASMA TREATMENT TO IMPROVE DUV PHOTORESIST PROCESS," an antireflective coating is deposited on a substrate through PECVD, and immediately thereafter, the substrate is placed in a gas discharge chamber where argon gas, oxygen gas, or a mixture of both is admitted with high density plasma. The oxide cap over the surface of the ARC immediately follows the ARC's deposition and is prior to exposure to air and later application of the photoresist. Importantly, Lee teaches that high density plasma having an ion density of about $10^9$ to $10^{13}$ ions per cubic centimeter is necessary to carry out the invention. With this plasma enhanced treating of the ARC, T-tops and footing growth is significantly reduced along the edges of the lines formed in the photoresist.

In U.S. Pat. No. 6,417,559 issued to Moore, et al., on Jul. 9, 2002, entitled "SEMICONDUCTOR WAFER ASSEMBLIES COMPRISING PHOTORESIST OVER SILICON NITRIDE MATERIALS," a silicon nitride layer having two distinct portions of different composition is taught, having a predominant nitride barrier over a silicon nitride layer. This layer promotes adhesion of the photoresist. Importantly, there is no antireflective coating formed between the silicon nitride layer and the photoresist. Instead, the photoresist is formed directly against the upper portion of the silicon nitride layer. Amino group transports due to impurities in the ARC are thus eliminated.

In U.S. Pat. No. 6,103,456 issued to Tobben, et al., on Aug. 15, 2000, entitled "PREVENTION OF PHOTORESIST POISONING FROM DIELECTRIC ANTIREFLECTIVE COATING IN SEMICONDUCTOR FABRICATION," a dielectric spacer layer is taught to prevent reactive nitrogenous substance transport through the antireflective coating layer to the photoresist layer. An arrangement of silicon oxynitride as an ARC layer for a photoresist layer is disclosed as preventing out-diffusion of reactive nitrogenous substances so as to avoid poisoning the photoresist layer and consequent photoresist footing or pinching problems. In Tobben, the application of a specialized ARC layer with a dielectric spacer over the ARC layer prevents unwanted amino group transport.

The problems associated with prior art attempts to remove amino groups from the ARC deal substantially with process, such as, necessitating a plasma application, or applying a layer over the ARC and under the photoresist, where process time delays can lead to more aggressive amino group production. Furthermore, the applications of prior art processes to 193 nanometer technology is prohibitive.

Bearing in mind the problems and deficiencies of the prior art, it is therefore an object of the present invention to provide a process that eliminates amino group transport to the photoresist layer while facilitating semiconductor wafer fabrication.

It is another object of the present invention to provide an alternative to plasma-enhanced applications for eliminating footings and T-tops in photoresist layers on semiconductors employing antireflective coatings.

It is a further object of the present invention to reduce line profile distortion in photoresist during processing.

Still other objects and advantages of the invention will in part be obvious and will in part be apparent from the specification.

SUMMARY OF THE INVENTION

The above and other objects and advantages, which will be apparent to one of skill in the art, are achieved in the present invention, which is directed to, in a first aspect, a method of applying a photoresist to a semiconductor substrate in a process chamber comprising: providing the substrate having a silicon nitride layer thereon; depositing an oxynitride layer over the silicon nitride layer; depositing an antireflective coating on the oxynitride layer; introducing a photoresist mask onto the antireflective coating; and further processing the substrate with the photoresist mask to form a pattern having dimensions that are unaffected by amino group transport. The oxynitride layer may be deposited at a thickness of less than 100 angstroms, at a thickness of less than 10 angstroms, at a thickness of approximately 5 to 10 angstroms, or at a thickness of approximately 10 to 20 angstroms. Depositing an oxynitride layer further comprises admitting nitrous oxide ($N_2O$) and oxygen ($O_2$) into the process chamber. The oxynitride layer may be a compound of the form $SiO_xN_y$. The antireflective coating is either an organic or inorganic material. Depositing the oxynitride layer comprises converting the silicon nitride layer to $SiO_xN_y$ via oxidation. The method may further comprise applying an $O_2$ plasma clean or an ozone clean after depositing the oxynitride layer.

In a second aspect, the present invention is directed to a method for eliminating line profile distortion in a photoresist layer comprising: providing a semiconductor substrate having a top surface; applying a silicon nitride layer to the top surface; exposing the silicon nitride layer to an oxidizing ambient by introducing a mixture of $N_2H_2$ and oxygen ($O_2$) ash; applying a plasma clean to the substrate; layering the layered substrate with an antireflective coating; and applying a photoresist to the antireflective coating. The step of exposing the silicon nitride layer may further comprise introducing the mixture at a temperature greater than or equal to 250° C.

In a third aspect, the present invention is directed to a layered semiconductor substrate prohibiting amino group initiated line distortion in a photoresist layer comprising: a silicon nitride layer on top of the layered substrate; an oxynitride layer on the silicon nitride layer; an antireflective coating layer on the oxynitride layer; and a photoresist layer on the antireflective coating layer.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 2A:
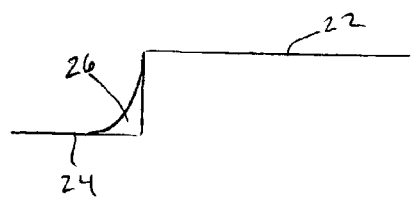
FIG. 2A depicts a cross-section of a photoresist dimensional feature having a top portion and bottom portion, and showing the bottom portion with footings generated by amino group transport.
Figure 2B:
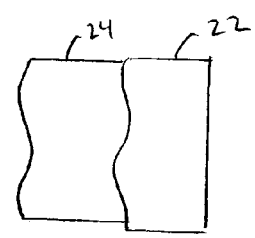
FIG. 2B is a top-view of the photoresist of FIG. 2A.
Figure 3:
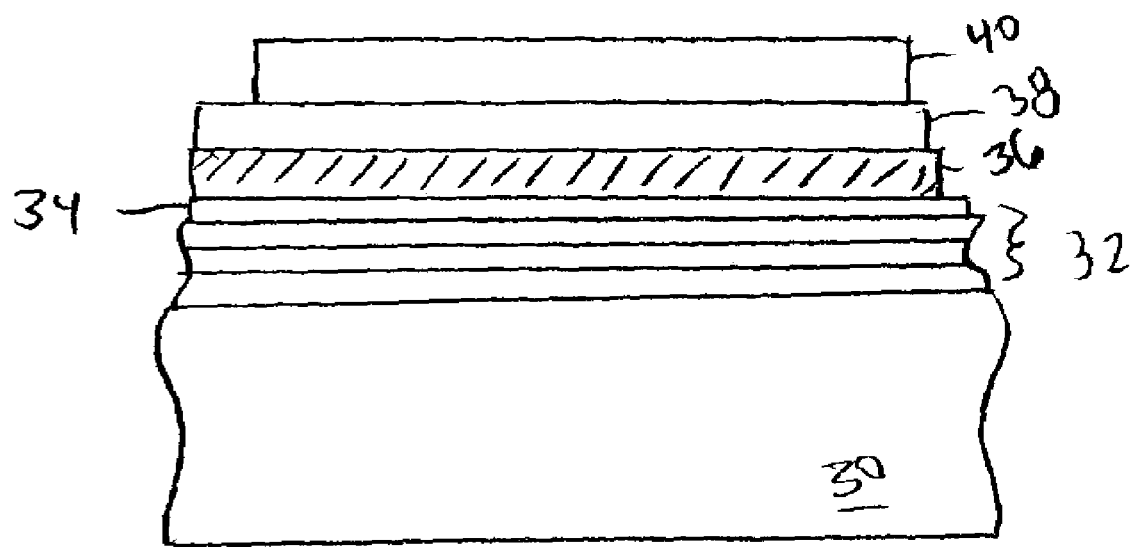
FIG. 3 is a schematic of the preferred embodiment of the present invention.

In describing the preferred embodiment of the present invention, reference will be made herein to FIGS. 1–3 of the drawings in which like numerals refer to like features of the invention. Features of the invention are not necessarily shown to scale in the drawings.

Figure 1:
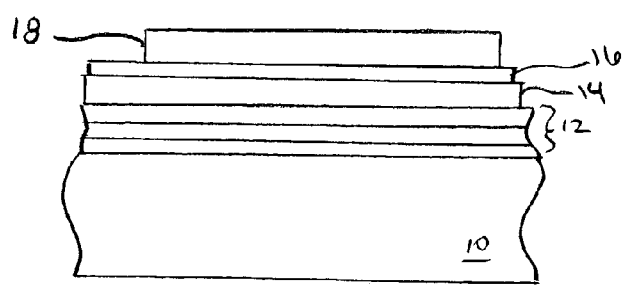
FIG. 1 is a schematic of a layered substrate having undergone the prior art process steps of eliminating the encroachment of amino groups.

FIG. 1 depicts a layered substrate 10 having undergone the prior art process steps of eliminating the encroachment of amino groups and their adverse affects on a photoresist layer. Typically a silicon nitride (SiN) layer 14 is deposited over a substrate 10 having a plurality of layers 12 thereon, readying the substrate for a photoresist process. Prior to the photoresist layer 18, however, is the placement of an antireflective coating (ARC) layer 16, which is imposed to eliminate spurious reflections back to the photoresist. The layered substrate is then placed in a gas discharge chamber where argon gas, oxygen gas, or a mixture of both gases are administered. High density plasma is then initiated. Upon completion of the high density plasma application, the substrate is removed from the chamber and the photoresist process is resumed, which includes exposure and subsequent lithographic process steps.

Feature sidewall roughness of the photoresist has been exhibited as a result of surface concentrations of amino groups. FIG. 2A depicts the cross-section 20 of a photoresist having a top portion 22 and bottom portion 24. Bottom portion 24 is shown with footings 26, which represent unwanted growth on the photoresist due to amino group transport from the underlying layers. FIG. 2B is a top-view of the top 22 and bottom 24 portions. This unwanted growth results in line distortions that make the application of 193 nanometer technology difficult to achieve.

The present invention includes conversion of the surface layer to reduce the amino group transport onto the photoresist layer. This oxynitride layer is preferably on the order of 5 to 10 angstroms thick, and placed over the silicon nitride layer but underneath the antireflective coating layer. FIG. 3 depicts the preferred embodiment of the present invention. Substrate 30 is shown having a plurality of layers 32 thereon. Silicon nitride 34 is deposited on top of the layered substrate. By its composition, this SiN layer inherently has amino groups on its surface. An oxidation process is performed thereby forming a thin oxynitride layer 36 ($SiO_xN_y$) over the silicon nitride layer 34, capping and containing the amino groups from propagating to the antireflective coating layer 38, which is subsequently applied to the oxynitride layer. The amino groups, if left unchecked, would change the properties of the antireflective coating and resist, due in part to their acidity. Last, a photoresist 40 is deposited upon the antireflective coating 38, free from amino group production due to the addition of the thin oxynitride layer 36.

Importantly, the generation of oxynitride layer 36 does not require plasma. An expeditious, non-plasma process to convert nitride to a top surface layer of approximately 5 to 10 angstroms thick oxynitride is sufficient to prohibit amino group transport.

A preferred process for forming the oxynitride uses a high temperature step of nitrous oxide ($N_2O$) plus oxygen ($O_2$) at approximately 300° C. for about 50 to 120 seconds. By oxidizing the silicon nitride layer, the roughness resulting from the adverse affects of amino group transport is significantly improved. Further, this high temperature step process can be used with the more advanced 193 nanometer technology, and is not limited to the 248 nanometer technology.

Although the process disclosed above is not predicated upon the application of plasma, it remains possible to employ plasma during the deposition to achieve a similar result. As such, the application of an oxynitride layer over the silicon nitride is not limited to a non-plasma process. A second method for exposing the silicon nitride layer to an oxidizing ambient, prior to the application of antireflective coating, is to introduce a mixture of $N_2H_2$ and oxygen ($O_2$) ash at a temperature greater than or equal to 250° C. with an accompanying plasma for approximately six minutes. This oxidation step is typically used to burn off resist. However, in this case it is effective in converting the surface layer into oxynitride. This is followed by the subsequent layering of the ARC and photoresist.

Utilizing either of the preferred methods has been shown to result in a dimensionally stable photoresist pattern, without the ill effects attributable to amino group transport.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of applying a photoresist to a semiconductor substrate in a process chamber comprising:
   providing said substrate having a silicon nitride layer thereon;
   depositing an oxynitride layer directly over and in contact with said silicon nitride layer, as a means to prevent amino group transport;
   depositing an antireflective coating on said oxynitride layer, such that said oxynitride layer is directly between and in contact with said silicon nitride layer and said antireflective coating;
   introducing a photoresist mask directly over and in contact with said antireflective coating;
   applying $N_2H_2$ combined with $O_2$ ash at a temperature exceeding 250° C. and exposing said semiconductor substrate to a plasma for six minutes, prior to depositing said antireflective coating and introducing said photoresist and further processing said substrate with said photoresist mask to form a pattern having dimensions that are unaffected by said amino group transport.

2. The method of claim 1 further comprising depositing said oxynitride layer at a thickness of less than 100 angstroms.

3. The method of claim 1 further comprising depositing said oxynitride layer at a thickness of less than 10 angstroms.

4. The method of claim 1 further comprising depositing said oxynitride layer at a thickness of approximately 5 to 10 angstroms.

5. The method of claim 1 comprising depositing said oxynitride layer having a compound of the form $SiO_xN_y$.

6. The method of claim 1 wherein said antireflective coating is either an organic or inorganic material.

7. The method of claim 1 further comprising depositing said antireflective coating using spin-coating.

8. The method of claim 1 wherein said photoresist is exposed to radiation in the ultraviolet regime.

9. The method of claim 1 wherein said step of depositing an oxynitride layer comprises converting said silicon nitride layer to $SiO_xN_y$ via oxidation.

10. The method of claim 1 further comprising depositing said oxynitride layer at a thickness of approximately 10 to 20 angstroms.

11. The method of claim 1 wherein said oxynitride layer is deposited using an LPCVD process.

* * * * *